United States Patent
Zakel et al.

(10) Patent No.: US 6,277,660 B1
(45) Date of Patent: Aug. 21, 2001

(54) METHOD AND APPARATUS FOR TESTING CHIPS

(75) Inventors: Elke Zakel; Frank Ansorge; Paul Kasulke; Andreas Ostmann; Rolf Aschenbrenner; Lothar Dietrich, all of Berlin (DE)

(73) Assignee: Fraunhofer-Gesellschaft zur Forderung der angewandten Forschung e.V., Munich (DE)

(*) Notice: Subject to any disclaimer, the term of this patent is extended or adjusted under 35 U.S.C. 154(b) by 0 days.

(21) Appl. No.: 09/497,437

(22) Filed: Feb. 3, 2000

Related U.S. Application Data (62) Division of application No. 08/709,344, filed on Sep. 6, 1996, now Pat. No. 6,211,571.

(30) Foreign Application Priority Data

Sep. 8, 1995 (DE) .............................. 195 33 170
Jan. 12, 1996 (DE) .............................. 196 00 994

(51) Int. Cl.[7] .................................................. H01L 21/26
(52) U.S. Cl. .................. 438/14; 438/15; 438/6; 438/118; 438/126
(58) Field of Search ................... 438/6, 10, 11, 438/12, 13, 14, 15, 17, 18, 115, 118, 119, 120, 121, 122, 123, 124, 125, 126, 127

(56) References Cited

U.S. PATENT DOCUMENTS

| | | | | |
|---|---|---|---|---|
| 5,196,371 | * | 3/1993 | Kulesza et al. | 437/183 |
| 5,289,346 | * | 2/1994 | Carey et al. | 361/777 |
| 5,346,857 | * | 9/1994 | Scharr et al. | 437/183 |
| 5,475,317 | * | 12/1995 | Smith | 324/760 |
| 5,846,853 | * | 12/1998 | Otsuki et al. | 438/119 |
| 5,930,597 | * | 7/1999 | Call et al. | 438/106 |
| 5,989,937 | * | 11/1999 | Variot et al. | 438/108 |
| 6,077,725 | * | 6/2000 | Degani et al. | 438/108 |
| 6,136,047 | * | 10/2000 | Karasawa et al. | 29/25.01 |

FOREIGN PATENT DOCUMENTS

06051149  *  2/1994  (JP).

\* cited by examiner

*Primary Examiner*—Matthew Smith
*Assistant Examiner*—Renzo N. Rocchegiani
(74) *Attorney, Agent, or Firm*—Darby & Darby (57) ABSTRACT

Method and apparatus for the testing of substrates which are provided with a wiring structure, in particular, chips (21), in conjunction with which, by means of a solder-deposit carrier (25) which is provided with a structured, electrically conductive coating (12) with bond pads (17) for the arranging of solder deposits (28) and their transfer to correspondingly arranged bond pads (22) of a substrate (21), an electrical check of the wiring structure of the substrate (21) takes place during the transfer of the solder deposits (28).

10 Claims, 4 Drawing Sheets

METHOD AND APPARATUS FOR TESTING CHIPS

This is a division, or application Ser. No. 08/709,344, filed Sep. 6, 1996 now U.S. Pat. No. 6,211,571. Each of these prior applications is hereby incorporated herein by reference, in its entirety.

BACKGROUND OF THE INVENTION

1. Field of the Invention

The present invention pertains to a method for testing a substrate which is provided with a wiring structure, in particular, a chip in accordance with the introductory clause of claim 1, a solder-deposit carrier in accordance with the introductory clause of claim 11 which can be used with this method, and a solder deposit in accordance with the introductory clause of claim 19, which can be used on the solder-deposit carrier.

2. Discussion of the Related Art

The manufacture of an IC that is assembly-ready, such as is used in electronic devices for EDP for example, is divided into a large number of manufacturing steps from a wafer to an encased, assembly-ready chip.

Apart from the costs that are caused by the manufacturing of the wafer, the costs for the manufacturing of an assembly-ready, packaged chip are primarily caused by the subsequent manufacturing steps. These steps are primarily the creation of so-called bumps on the bond pads of the chips, which are created from the wafer by singling them out, and the expensive packaging of the chips. As a rule, for the quality control of the chips, an electrical check of the chip's strip conductors is carried out after the chip has been encased. Many times, however, the causes for the malfunctioning of a chip have their base in one of the manufacturing steps which precede the packaging of the chip, so that faulty chips which represent rejects even before the encasing, are packaged unnecessarily. As a result, the costs associated with what will be a reject in any case are increased even further.

Even in the so-called "flip-chip technology" in which chips are bonded directly to a substrate by means of increased contact metallization applied to the chip bond pads, a quality control check of the chips, or even of the complete wafers that are used in the flip-chip process, is not carried out until after the production of the connection. Overall, the processing of chips or complete wafers by means of the flip-chip method leads to complex structures which do not allow for the complete testability of individual chips or complete wafers under defined test conditions, such as are prescribed for a burn-in test, for example, without risk to the entire structure when using known test methods.

While it is indeed known in the art to check individual chips or even complete wafers with appropriate test devices before carrying out a subsequent connecting technique, a quality check of such a type can only be carried out, however, with exceptional effort, which is in addition to the carrying out of the connecting technique which is already complex in itself.

SUMMARY OF THE INVENTION

The present invention therefore performs the task of suggesting a method and an apparatus by means of which it is possible to carry out a quality control check in a cost-effective way even before the manufacturing stage of the packaging of the chip and before the carrying out of the connecting technique.

This task is carried out by means of a method with the characterizing features of claim 1 and an apparatus with the characterizing features of claims 11 and 19.

With the method in accordance with the invention, by means of a solder-deposit carrier which is provided with a structured, electrically conductive coating with bond pads for the arranging of solder deposits and their transfer to appropriately placed bond pads of a substrate, an electrical check of the wiring structure of the substrate is carried out during the transfer of the solder deposits.

In this way, the substrate, which can, for example, be configured as a printed circuit board with a more or less complex wiring structure or as a chip, can be tested with respect to its proper functioning by means of an individual contacting of its bond pads by the solder-deposit carrier.

As a result, it becomes clear that the electrical testing of the wiring structure of the substrate during its manufacturing process is not linked with an additional processing step. Rather, as a result of the method in accordance with the invention, an almost inherent quality test is made possible during a manufacturing step which is necessary in any case. In addition, the electrical checking of the wiring structure of the substrate takes place before its completion by means of a final encasing, or before the production of a final contacting in the flip-chip method, so that the further processing of substrates with defective wiring structures is avoided.

If before the placement of the solder deposits on the structured, electrically-conductive coating, a transfer mask with mask openings which leave the bond pads free is brought onto the coating, methods other than an application of pellets of solder material can be used for the forming of the solder deposits on the solder-deposit carrier. Along with a chemical deposition of solder material for forming the solder deposits in the mask openings, a galvanic deposition of solder material for the forming of solder deposits on the bond pads is well-suited in a special way because of the electrically conductive coating which is needed in any case for the carrying out of the test. In conjunction with this, the form of the solder deposits is in essence determined by the shape of the mask openings. In addition, it is also possible to apply the solder material in the form of solder paste.

An especially sure contact between the solder-deposit carrier that is being used as the test contact arrangement and the bond pads of the substrate is provided if, after the production of a physical contact between the solder deposit of the solder-deposit carrier and the bond pads of the substrate, at least a partial fusing of the solder deposit takes place for the production of a solder interconnection between the solder-deposit carrier and the substrate. This solder interconnection can be brought about by means of a wetting of the bond pads of the substrate, that is, more or less by means of a conforming, positive interlocking between the solder deposits and the bond pads, or, depending on the subsequent solidification of the solder deposits, as a continuous material interconnection between the solder deposits and the bond pads. In each case, the solder interconnection ensures a good contact during the electrical testing of the wiring structure of the substrate with the smallest possible contact resistance.

If, when there is a partial fusing of the solder deposits, there first takes place a fusing of a contact part which is placed adjacent to the bond pad of the substrate, and subsequently a fusing of a base part that borders the contact part, the possibility exists of carrying out the fusing that is necessary for the transfer of the solder deposit in two stages, namely, a contact melting and a transfer melting, which are characterized by differing temperatures, in order to be able in this way to select, independently of the solder material composition of the base part, a solder material composition of the contact part that is designed, with respect to its melting point, for the test temperature that is prescribed for the test.

Forming the basis for the preceding process methodology is the idea of being able to establish the positive-interlocking solder connection, which is especially advantageous for the carrying out of the test and which is characterized by the smallest possible contact resistance, independently of the material composition of the base part, which in essence determines the electrical characteristics of the solder deposit.

Particularly from the energetic standpoint, it is especially advantageous if, during the electrical checking of the wiring structure of the substrate, the contact part is in a molten state and the base part is in a solid state. However, the testing can also be carried out with the contact part and the base part in a solid state.

If during the transfer of the totally molten solder deposit, there is also a co-transfer of a bond-pad metallization placed on the bond pads of the electrically conductive coating of the solder-deposit carrier, the possibility that the solder material of the solder deposit can remain behind on the bond pads of the solder-deposit carrier during the transfer, and that only an incomplete transfer of the solder deposit takes place, is eliminated with certainty.

It has also proven to be advantageous if the energy necessary for the fusing of the solder deposits is brought into the solder deposit at least partly by means of the electrically conductive coating of the solder-deposit carrier. As a result of this, it is possible, even during the test of the wiring structure, to set a heat distribution which corresponds at least approximately to that of actual operation, in which temperature peaks occur in the region of the bond pads.

In addition, it has also proven to be advantageous if, during the existence of the interconnection between the solder-deposit carrier and the substrate, a tempering of the substrate is carried out by means of the electrically conductive coating of the solder-deposit carrier. By doing this, the application of heat to the substrate, which is linked with the fusing of the solder deposits in any case, can be used at the same time for the establishing of test conditions such as they exist, for example, in the so-called burn-in tests, a combination of a high-temperature environment and electrical operation.

If, for the transfer of the solder deposits from the solder-deposit carrier to the bond pads of the substrate, the substrate is lowered onto the solder deposit carrier from above with its bond pads in an overlap position with respect to the solder deposits, and is subsequently raised upwards along with the solder deposits that are adhering to the bond pads of the substrate, the transfer of the solder deposits can be carried out with the simultaneous testing of the wiring structure of the substrate during conventional flip-chip handling of the substrate. A particular advantage of this handling of the substrate consists in the fact that subsequently, a flip-chip contacting of the substrate can take place for arranging on an additional substrate, without it being necessary to change the handling apparatus. Thus, an uninterrupted further processing of the chip, which has been checked according to the method in accordance with the invention, is easily possible, for example, for constructing a multi-chip module. In addition, the substrate and the solder-deposit carrier can also be arranged in reverse fashion for the transfer.

If the at least partial fusing of the solder deposits and/or their transfer from the solder-deposit carrier to the substrate is carried out in a gaseous or liquid reducing or inert medium, it can be ensured that the solder deposits can be protected from harmful environmental influences to the greatest extent possible during the fusing and transfer of the solder deposits. The medium that is used in conjunction with this can consist of a protective gas or even a liquid medium. Polyalcohols such as glycerine, tetraethylene glycol and polyethylene glycol, and stearins are suitable as liquid mediums.

An apparatus is known from U.S. Pat. No. 5,217,597 for the transfer of solder deposits to bond pads of a substrate which is provided with a wiring structure, in conjunction with which a solder-deposit carrier exhibits a carrier layer with an electrically conductive coating with bond pads for the arranging of solder deposits and their transfer to correspondingly arranged bond pads of the substrate. In the case of the apparatus in accordance with the invention, the electrically conductive coating of the solder-deposit carrier exhibits a wiring structure.

Thus, in accordance with the invention, the solder-deposit carrier that is used for the transfer of solder deposits to bond pads of a substrate makes possible a simultaneous electrical check of the wiring structure by means of an individual contacting of the contacts of the substrate.

If the bond pads for the arrangement of the solder deposits are defined by means of mask openings in a transfer mask which is placed on the coating, it is not only possible to use methods for the application of the solder deposits in an essentially solid form, it is also possible to use methods for the application of the solder deposits by means of chemical or galvanic deposition, in which the solder material is thus not present in solid form, but rather in liquid form.

If the bond pads of the solder-deposit carrier exhibit a smaller wetting area than the bond pads of the substrate, a fusing and a subsequent delivery of the fused solder deposits is possible, based on the greater adhesive force between the fused solder deposits and the bond pads of the substrate, by means of a simple lifting of the substrate from the solder-deposit carrier, without the bond pads of the solder-deposit carrier having to exhibit a bonding-pad metallization that is incapable of being wetted. As a result, the forming of the electrically conductive coating of the solder-deposit carrier can be carried out as a simple, structured metallization.

If the bond pads of the solder-deposit carrier are provided with a bond-pad metallization which inhibits wetting or is incapable of being wetted, it is possible to configure the bond pads of the solder-deposit carrier in such a way that they match in area the bond pads of the substrate.

For the forming of a bond-pad metallization that is incapable of being wetted or is unwettable, it has turned out to be advantageous if it exhibits a tungsten/titanium alloy or an alloy made of tungsten and a titanium oxide.

Aside from the two-component alloy mentioned above, multiple-component alloys can also be used for forming a bond-pad metallization that is incapable of being wetted or is unwettable. Depending on the solder material that has been selected for the solder deposits, single-component metallizations such as tungsten, titanium, chrome, tantalum or molybdenum, or even their oxides, are also especially well-suited.

In principle, an unwettable bond-pad metallization exhibits the advantage that any adhesion between the bond-pad metallization and the solder deposit is possible only when the solder material is in the solid, solidified state. During the fusing of the solder deposit, a decrosslinking and detachment of the solder-deposit material from the unwettably configured bond-pad metallization takes place, so that no further adhesion takes place and a simple, essential residue-free transfer of the solder material from the solder-deposit carrier to the substrate can take place with no special separating forces being necessary.

A further possibility for making possible an essentially residue-free transfer of solder material from the solder-deposit carrier to the substrate consists in providing the bond pads of the solder-deposit carrier with a wettable bond-pad metallization that is soluble in the solder material of the solder deposit. Specifically, with such a selection of the material for the bond-pad metallization, a co-transfer of the bond-pad metallization takes place along with the solder material of the solder deposit. It proves to be especially advantageous in this context, if with a wettably configured bond-pad metallization, an electrically conductive coating which is placed underneath is configured so it is unwettable, so that with the co-transfer of the bond-pad metallization, the structured, electrically conductive coating of the solder-deposit carrier is kept essentially intact, so that the re-use of the solder-deposit carrier is ensured.

It has turned out to be advantageous for the configuring of a wettable bond-pad metallization if the latter exhibits a gold or palladium alloy.

In order to make possible the partial fusing which has been described in the above as advantageous during the transfer of the solder deposits from the solder-deposit carrier to the substrate, the use of a solder deposit with the characterizing features of claim 17 has proven to be especially advantageous. However, even independently of the transfer of solder deposits from a solder-deposit carrier onto a substrate, the solder deposit with the characterizing features of claim 17 has proven to be advantageous in the testing of electronic components or elements.

The configuring of a solder deposit with a contact part and a base part, in conjunction with which the melting temperature of the contact part is lower than the melting temperature of the base part, specifically makes possible an especially low-resistance contacting for test purposes, such as for a "burn-in test", without it being necessary to fuse the entire solder deposit with the correspondingly high temperature loading on the substrate. When this is done, the solder-deposit carrier assumes the function of a test board or a test substrate, and with respect to the solder deposits, this can involve the raised contact metallizations which have already been applied to the bond pads of a substrate and which are known by the industry term "bumps".

It proves to be especially advantageous if the melting temperature of the contact part is essentially the same as the test temperature prescribed for the electrical checking of the wiring structure of the substrate, since in that way, in essence only that amount of energy has to be applied for the fusing of the contact part as is necessary for attaining the test temperature.

If the base part and the contact part exhibit the same alloy components, and, unlike the base part, the contact part exhibits a eutectic composition, the advantages explained above for the solder deposit made of a base part and a contact part with a total of only two alloy components are possible with a contact-part melting temperature that is as low as possible.

BRIEF DESCRIPTION OF THE DRAWINGS

In the following, the method in accordance with the invention and the apparatus in accordance with the invention are explained in more detail with the aid of the embodiments represented in the drawings. The following are shown.

DETAILED DESCRIPTION OF A PREFERRED EMBODIMENT

Figure 1:
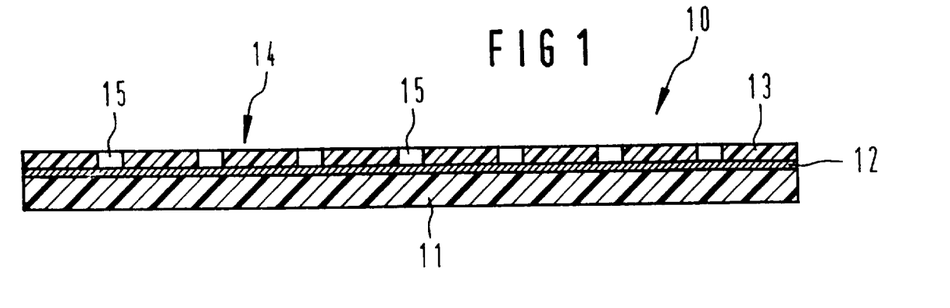
FIG. 1, a cross-sectional representation of a solder-deposit carrier.

FIG. 1 shows a solder-deposit carrier 10 with a carrier layer 11 and an electrically conductive coating which is applied to the carrier layer 11 and which is configured here as a structured metallization in the form of a wiring structure 12. Located on the wiring structure 12 is a photo-sensitive polymer layer 13, which is structured in the manner shown by means of a photo-lithographic process that is known in the art in order to form a transfer mask 14, and which exhibits mask openings 15.

Figure 2:
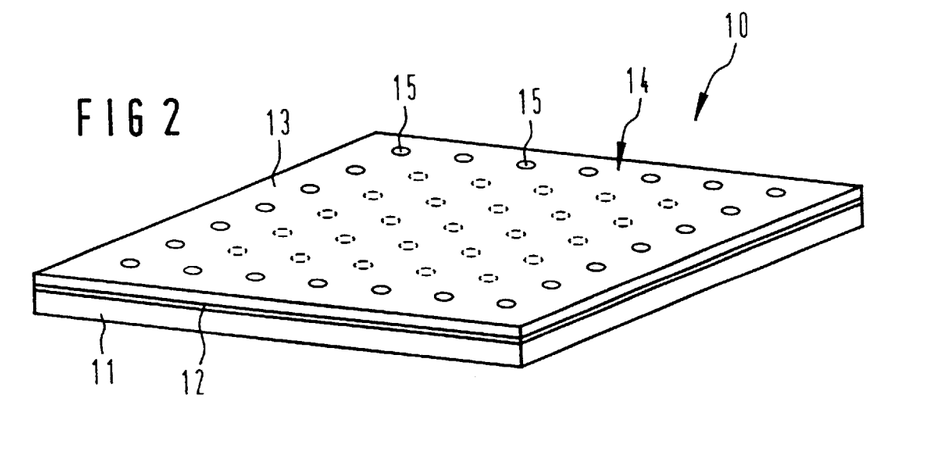
FIG. 2, a perspective representation of the solder-deposit carrier shown in FIG. 1.

FIG. 2 shows the transfer mask 14 with the mask openings 15 in a top view. Along with the mask openings 15, which are placed in continuous lines parallel to the circumference of the solder-deposit carrier 10 and which correspond in their placement to the conventional input/output contact pad arrangement of a chip, there are additional mask openings 15 drawn in, which are distributed uniformly over the inner region of the polymer layer 13 of the embodiment shown in FIG. 2, which are shown by means of dashed lines, and which are intended to make clear that the solder-deposit carrier 10 can just as well be provided with a transfer mask 14, which corresponds to a so-called "area array configuration" with respect to its arrangement of mask openings 15.

Figure 3:
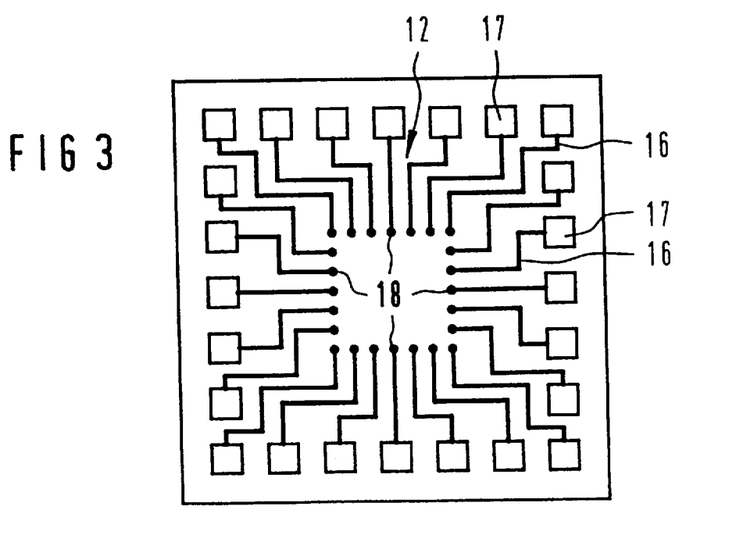
FIG. 3, a structured metallization of the solder-deposit carrier.

For the input/output bond-pad arrangement of the mask openings 15, the wiring structure 12 is shown in FIG. 3. As becomes clear by means of a comparison with FIGS. 2 and 3, at the ends of individual strip conductors 16 of the wiring structure 12 there are bond pads 17 which are placed underneath the associated mask openings 15, so that by means of the transfer mask 14, an external contacting of the bond pads 17 is possible.

Figure 4:
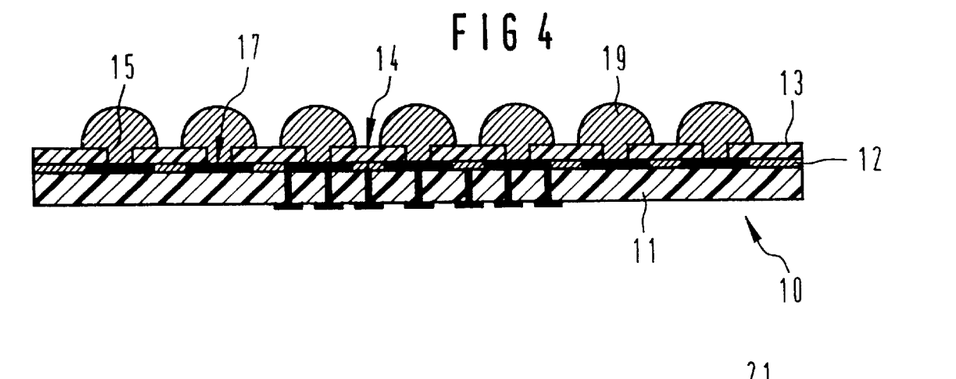
FIG. 4, a cross-sectional representation of the solder-deposit carrier corresponding to the representation in FIG. 1, with solder deposits placed on bond pads of the solder-deposit carrier.

FIG. 4 shows the solder-deposit carrier 10 with solder deposits 19 arranged on the mask openings 15. The placing of the solder deposits 19 on the mask openings 15 can be carried out by means of galvanic solder deposition, in which the strip conductors 16 of the wiring structure 12 are short-circuited with each other and the entire wiring structure 12 thus serves as electrode, and the deposition of solder material in the form of solder deposits 19 is carried out onto their contact pads 17, which are freed by the transfer mask 14. In conjunction with that, any depositing of solder material onto the remaining regions of the transfer mask 14 is prevented by its configuration as an incapable of being wetted, non-conductive polymer layer 13, possibly made of polyamide or PCB. An incapable of being wetted, non-conductive surface on the transfer mask 14 can also be achieved through the use of an oxide or nitride layer.

With an appropriate configuration of the transfer mask, in particular, with larger dimensioning of the mask openings 15, instead of a galvanic deposition of solder material as described above for forming the solder deposits 19, it is also possible to place the solder deposits into the mask openings 15 in a solid form.

Figure 5:
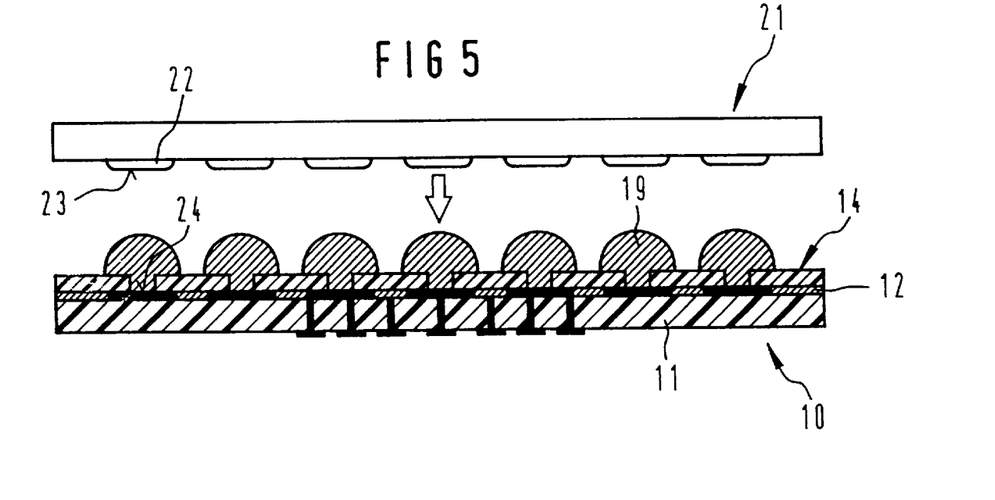
FIG. 5, a chip placed in an overlap position above the solder-deposit carrier shown in FIG. 4, for subsequent transfer of the solder deposits onto the bond pads of the chip by means of the flip-chip process.

Independently of the manner of placing or forming the solder deposits 19 on the bond pads 17 of the wiring structure 12, a substrate, which is here configured as a chip 21, is subsequently brought with its raised contact metallizations, which form its bond pads and which will be designated by the industry term bumps 22 in the following, into an overlap position with the solder deposits 19 of the solder-deposit carrier 10, as is shown in FIG. 5, and is lowered onto the solder deposits 19 in order to form a physical contact between the latter and the bumps 22.

Figure 6:
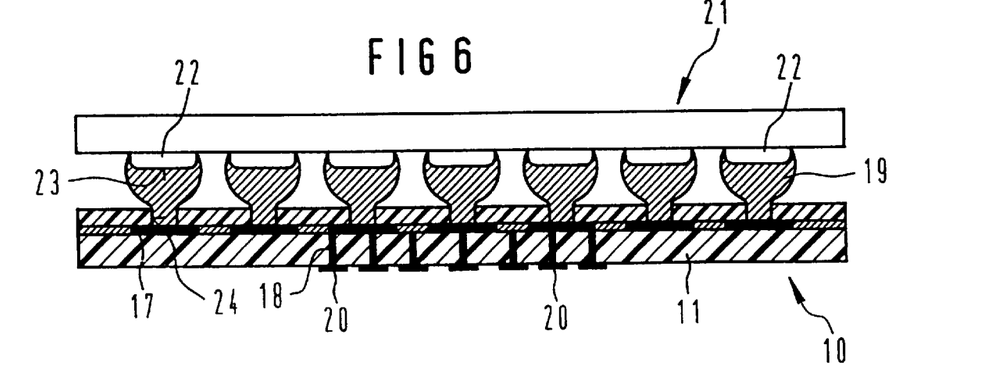
FIG. 6, the chip shown in FIG. 5, with its bond pads lowered onto the fused solder deposits for the forming of a transfer/test configuration.

As is shown in FIG. 6, a fusing of the solder deposits 19 takes place after that, so that wetting shown in FIG. 6 of the bumps 22 by the fused solder deposits 19 occurs. In order to ensure that no deviations from the overlap position shown in FIG. 6 between the bumps 22 and the solder deposits 19 take place as a result of the fusing of the solder deposits 19 and the associated heating of the solder-deposit carrier 10 and the chip 21, both the carrier layer 11 of the solder-deposit carrier 10 as well as the material of the chip 21 should exhibit coefficients of expansion which are in essence matching. Slight differences between the coefficients of expansion can be compensated for by possible shifting of the fused solder deposits 19. With the embodiment that is shown here, silicon has been chosen for the carrier layer 11 of the solder-deposit carrier 10 to match the material of the chip 21.

Figure 7:
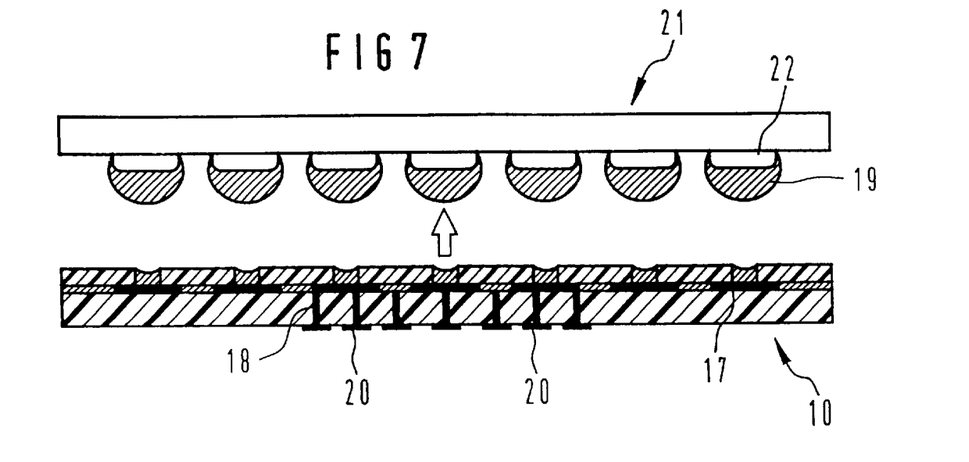
FIG. 7, the chip shown in FIG. 6, together with the solder deposits taken from the solder-deposit carrier.

Because the wetting area 24 of the mask openings 15 is many times smaller than the wetting area 23 of the bumps 22, the shape of the fused solder deposits 19 takes shape as is shown in FIG. 6, which makes it possible, with continuing wetting of the bumps 22 by the solder deposits 19 as is shown in FIG. 7, to lift the chip 21 from the solder-deposit carrier 10 together with the solder deposits. As is shown schematically in FIG. 7, in conjunction with this, only small portions of solder material remain on the transfer mask 14, which can easily be removed, possibly by wet-chemical means, with repeated use of the transfer mask 14 for the transferring of solder deposits 19 onto another chip 21.

As a result of the structured metallization shown in FIG. 3 for the forming of the wiring structure 12 with strip conductors 16 that are electrically separate from one another, during the contact shown in FIG. 6 between the chip 21 and solder-deposit carrier 10 for the purpose of the subsequent transfer of the solder deposits 19 to the bumps 22 of the chip 21, it is possible to carry out an electrical check of the wiring structure of the chip 21, which is not shown in more detail, by means of the solder deposits 19. For this purpose, the wiring structure of the chip 21 can be tested with a test voltage by means of a concerted addressing of the test contacts 20, which are located on the back side of the solder-deposit carrier 10 and which are connected with the strip conductors 16 by means of through-hole wires 18 (FIG. 3).

For producing a solid interconnection between the bond pads 17 of the solder-deposit carrier 10 and the bumps 22, a cooling of the fused solder deposits 19 is carried out. If a eutectic lead/tin alloy is being used for the solder material of the solder deposits 19 and gold-coated, wet-chemically created bumps 22 made of nickel are being used for the chip 21, for doing this, the temperature of the solder deposits must be reduced to below 180° C. following the fusing.

After the electrical check of the wiring structure of the chip 21 has been carried out, the solder deposits 19 are again heated to a temperature above 180° C. in order to fuse them and then lift the chip 21, together with the solder deposits 19 that are adhering to the bumps 22, from the solder-deposit carrier 10 as has been described above.

In principle, the above-described electrical check of the wiring structure of the chip 21 by means of the solder-deposit carrier 10 is also possible during the molten state of the solder deposits 19; what is of essence is the fact that during the electrical check, a secure contact exists between the bumps 22 of the chip 21 and the bond pads 17 of the solder-deposit carrier 10. This is also the case when there is a corresponding wetting of the bond pads 17 or the bumps 22. However, in order, for example, to carry out a bum-in test which is defined with respect to its boundary conditions, for instance, at a temperature of 150° C. over a period of 125 hours, with the solder material made of a lead/tin alloy that is being used here by way of example, the solder deposits 19 have to be converted to a solid state.

In the case of the embodiment that has been described with the aid of the Figures that have been explained above, the transfer of the solder deposits 19 from the solder-deposit carrier 10 to the chip 21 is in essence made possible by the different-sized wetting areas 23, 24 of the bond pads 17 of the solder-deposit carrier 10 and the bumps 22 of the chip 21. The different-sized adhesive forces which result from this between the fused solder deposits 19 and the bond pads 17 or the bumps 22 can, however, be achieved in another way. By way of example, it is thus possible, independently of the difference in sizes between the wetting areas 23 and 24, to achieve the necessary difference in the sizes of the adhesive forces by means of the fact that a barrier layer which inhibits wetting or is incapable of being wetted is applied to the bond pads 17 of the solder-deposit carrier.

Figure 8:
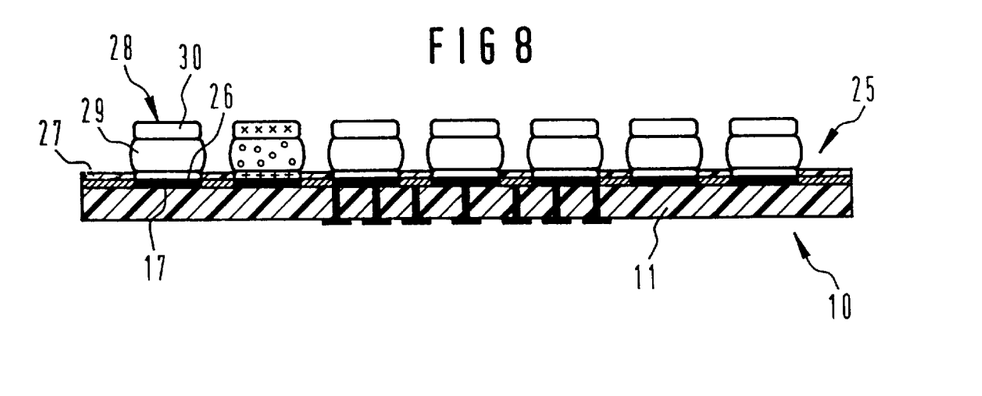
FIG. 8, a cross-sectional representation of another solder-deposit carrier with solder deposits with a base part and a contact part placed on the bond pads of the solder-deposit carrier.

In a variation of the solder-deposit carrier 10 shown in FIG. 4, FIG. 8 shows a solder-deposit carrier 25 which, in the embodiment shown here, does not hate a transfer mask. Apart from that, the solder-deposit carrier 25 exhibits the same elements and is provided with the identical reference numbers as the solder-deposit carrier 10.

The bond pads 17 of the solder-deposit carrier 25 are provided with a bond-pad metallization 26, whereas the remaining surface of the wiring structure 12 is covered with a passivation 27. Applied to the bond-pad metallization 26 are solder deposits 28, each of which consists of base part 29 which is directly contiguous with the bond-pad metallization 26, and a contact part 30 which is applied to the base part 29.

In the embodiment shown here, the solder deposits 28 are applied as pellets, by means of pressure welding, to the bond-pad metallizations 26 which are thin in comparison with the solder deposits 28, and especially in comparison with the base part 29 of the solder deposits 28. In conjunction with this, the solder deposits 28 are built up in two phases, whereby a interconnection of the base part 29 with the bond-pad metallization 26 is carried out first, and then "one story is added" to the base part 29 by the contact part 30 in order to form the complete solder deposit 28. Multiple-layer solder deposits that are built up in this way can also be produced in ways differing from the one just described, for example, through the layer-by-layer deposition of solder materials. In the case of the forming of the solder deposit from liquid materials, the use of the type of transfer mask shown in FIG. 4 again proves to be advantageous.

In the case of the solder deposits 23 shown in FIG. 8, both the base part 29 and the contact part 30 consist of a lead/tin alloy, in conjunction with which in alloy with high lead content such as PbSn 90/10 of PbSn 95/5 is chosen for the base part 29, while a eutectic lead/tin alloy is chosen for the contact part 30.

Figure 9:
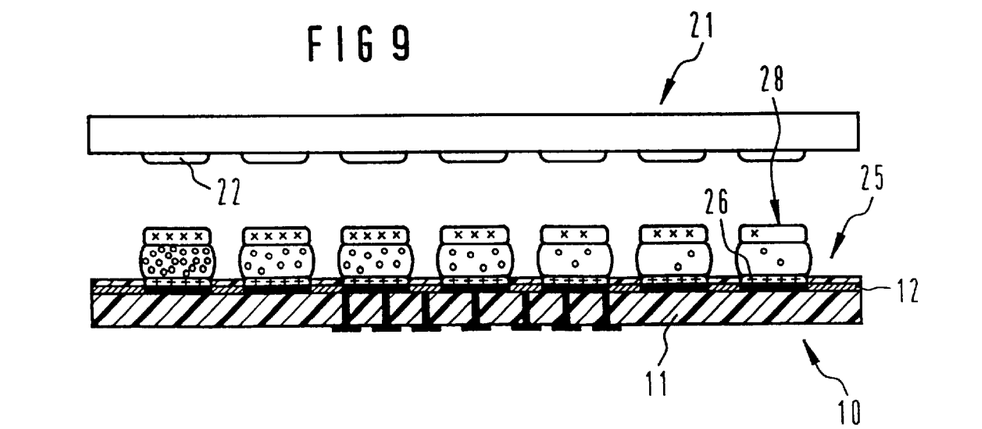
FIG. 9, a chip placed in an overlap position above the solder-deposit carrier shown in FIG. 8, for subsequent transfer of the solder deposits onto the bond pads of the chip by means of the flip-chip process.

Corresponding to the representation in accordance with FIG. 5, as is shown in FIG. 9, for the production of a test or transfer configuration, the chip 21 is brought with its bumps 22 in an overlap position with the solder deposits 28 of the solder-deposit carrier 25, and is lowered onto the solder deposits 28 in order to form a physical contact between the latter and the bumps 22.

Figure 10:
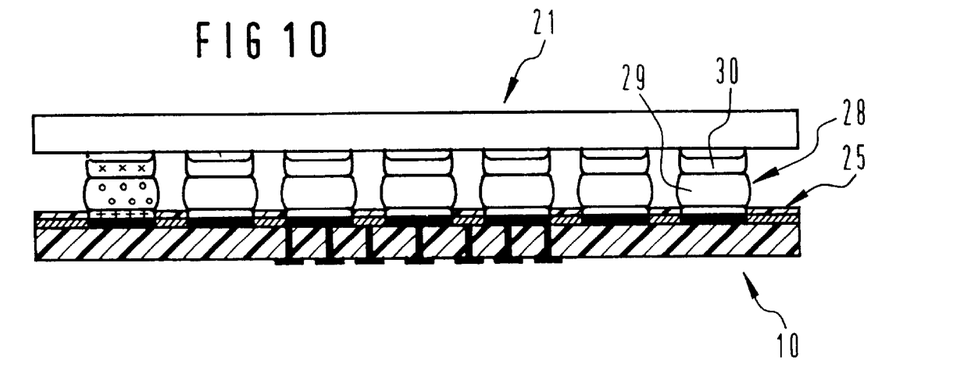
FIG. 10, the chip shown in FIG. 9, with its bond pads lowered onto the fused contact part of the solder deposits for the forming of a test configuration.

Following that, as is shown in FIG. 10, a fusing of the contact part 30 of the solder deposits 28 takes place, as a result of which a corresponding wetting of the wettable bumps 22 of the chip 21 takes place, along with the forming of a correspondingly good electrical contact.

In the pure test configuration that is shown in FIG. 10, the base part 29 of the solder deposit 28 continues to be in a solidified state. A positive-engagement bridge contact between the solder-deposit carrier 25 and the chip 21 is created by the fused contact part 30, so that the electrical check of the wiring structure of the chip 21, which has already been explained at length in interconnection with the solder-deposit carrier 10, can take place.

If a eutectic lead/tin alloy is used for the contact part 30, the fusing temperature of the contact part 30 is about 180° C., and thus lies in the region of a test temperature that is common for a burn-in test. In contrast with that, the melting temperature of the high lead-content base part is more than 200° C. If the solder deposit were formed in its entirety of a high lead-content alloy, a significantly higher temperature would then be necessary in order to bring about the fusing of the solder deposit and the intended positive-engagement contact between the solder deposits and the bumps on the chip for the purpose of an electrical check.

Figure 11:
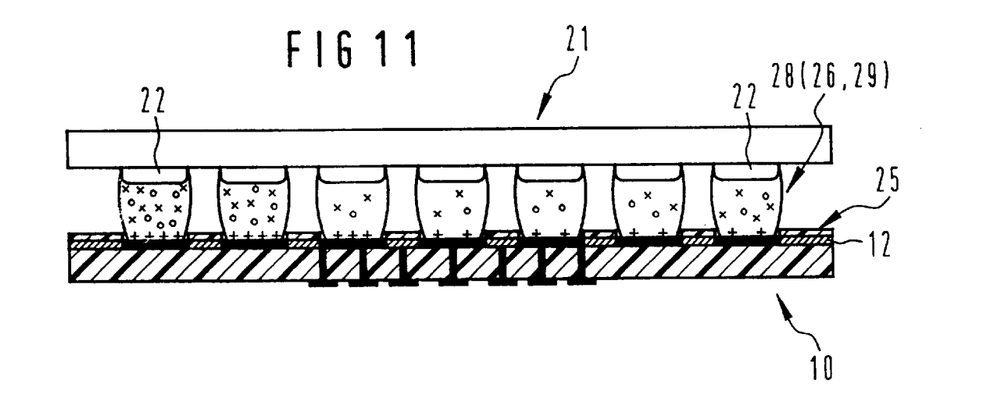
FIG. 11, the chip/solder-deposit carrier configuration shown in FIG. 10, in which the base part of the solder deposits is also fused along with the contact part of the solder deposits for forming a transfer configuration.

Only when, as a result of the fusing of just the contact part 30 of the solder deposits 28 in the test configuration shown in FIG. 10, the chip 21 has been found to be good during the electrical check, does an increase hi the temperature take place in accordance with the transfer configuration that is shown in FIG. 11, with the result that now the higher melting-temperature base part 29 of the solder deposit 28 also fuses.

Depending on the configuration of the bond-pad metallization 26 of the solder-deposit carrier 25, the subsequent transfer or delivery of the solder deposits 2.8 to the bumps 22 of the chip 21, which is brought about by the adhering of the solder deposits 28 to the wetted bumps 22 of the chip 21 and the release of the solder deposits 28 from the solder-deposit carrier 25 as a result of the raising of the chip 21, can take place along with the co-transfer of the bond-pad metallization 26.

Figure 12:
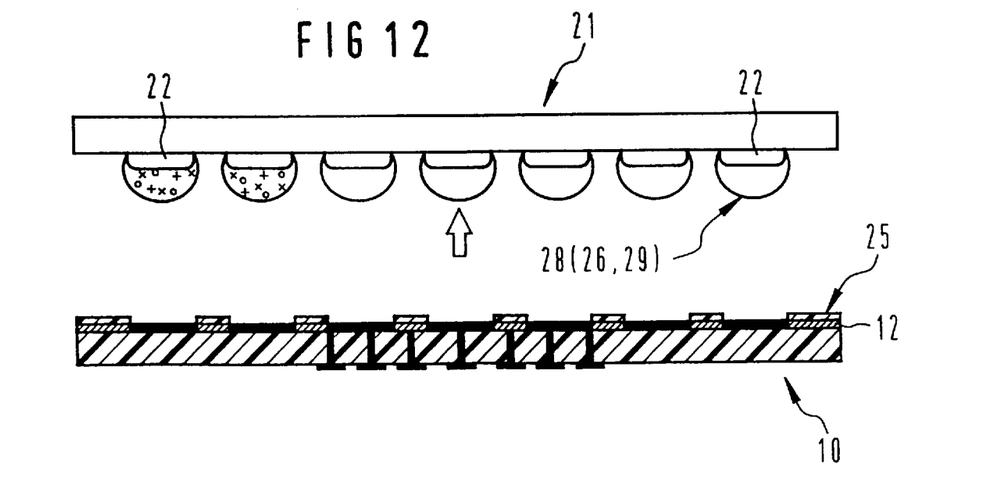
FIG. 12, the chip shown in FIG. 11, together with the solder deposits and the bond-pad metallizations taken from the solder-deposit carrier.

In the case of the embodiment shown here, the bond-pad metallization 26 is wettable and designed to be dissolved in the solder material of the solder deposit 28, whereas the material of the wiring structure 12 is chosen in such a way that it is not wettable, and any adhesion between the bond-pad metallization 26 and the wiring structure 12 is possible only in the solid state. Such a configuration of the bond-pad metallization 26 and the wiring structure 12 results in the fact that, as is shown in FIG. 12, the bond-pad metallization 26 is co-transferred during the raising of the chip 21, so that a residue-free, total transfer of the solder deposits 28 is guaranteed.

In the case of a bond-pad metallization 26 that is configured to be unwettable, a residue-free transfer of the solder deposits 28 from the solder-deposit carrier 25 to the bumps 22 of the chip 21 is assured, since in this case, adhesive forces between the solder deposits 28 and the bond-pad metallization 26, which work against a transfer of the solder deposits, are formed only when the solder deposits are in the solid state. In every case, it can prove to be advantageous if the fusing of the solder deposits 28 takes place in an inert or reducing atmosphere.

What is claimed is:

1. Method for the testing of substrates which are provided with a wiring structure, in particular, chips, characterized by the fact that by means of a solder-deposit carrier (10, 25) which is provided with a structured, electrically conductive coating (12) with bond pads (17) for the arranging of solder deposits (19, 28) and their transfer to correspondingly arranged bond pads (22) of a substrate (21), an electrical check of the wiring structure of the substrate (21) takes place during the transfer of the solder deposits (19, 28).

2. Method in accordance with claim 1, characterized by the fact that before the arranging of the solder deposits (19), a transfer mask (14) with mask openings (15) which free the bond pads (17) is applied to the coating (12).

3. Method in accordance with claim 1, characterized by the fact that after production of a physical contact between the solder deposits (19, 28) of the solder-deposit carrier (10, 25) and the bond pads (22) of the substrate (21), an at least partial melting of the solder deposits (19, 28) takes place in order to produce a solder interconnection between the solder-deposit carrier (10, 25) and the substrate (21).

4. Method in accordance with claim 3, characterized by the fact that in the case of a partial fusing of the solder deposits (28), first the fusing of a contact part (30) placed adjacent to the bond pads (22) of the substrate (21) takes place, and then the fusing of a base part (29) that is contiguous with the contact part (30).

5. Method in accordance with claim 4, characterized by the fact that during the electrical checking of the wiring structure (12) of the substrate (21), the contact part (30) is in the molten state and the base part (29) is in the solid state.

6. Method in accordance with claim 3, characterized by the fact that the energy needed for the fusing of the solder deposits (19, 28) is brought into the solder deposits (19, 28) at least partly by means of the electrically conductive coating (12) of the solder-deposit carrier (10, 25).

7. Method in accordance with claim 1, characterized by the fact that with the transfer of the completely molten solder deposits (28), a co-transfer of a bond-pad metallization (26) that is placed on the bond pads (17) of the electrically conductive coating (12) of the solder-deposit carrier (25) takes place.

8. Method in accordance with claim 1, characterized by the fact that during the existence of the interconnection between the solder-deposit carrier (10, 25) and the substrate (21) by means of the electrically conductive coating (12) of the solder-deposit carrier (10, 25), a tempering of the substrate (21) takes place.

9. Method in accordance with claim 1, characterized by the fact that for the transfer of the solder deposits (19, 28) from the solder-deposit carrier (10, 25) to the bond pads (22) of the substrate (21), the substrate (21) is lowered, with its bond pads (22) in an overlap position with the solder deposits (19, 28), onto the solder-deposit carrier (10, 25) from above, and is subsequently lifted up together with the solder deposits (19, 28) which are adhering to the bond pads (22) of the substrate (21).

10. Method in accordance with claim 1, characterized by the fact that the at least partial fusing of the solder deposits and/or their transfer from the solder-deposit carrier to the substrate takes place in a gaseous or liquid reducing or inert medium.

* * * * *